VARIABLE WIDTH NANOSECOND PULSE GENERATOR UTILIZING STORAGE DIODES HAVING SNAP-OFF CHARACTERISTICS

Filed Dec. 26, 1962

INVENTORS:
WILLIAM PEIL,
DAVID L. BERRY, DECEASED,
BY LOMOND I. BERRY
AND MARY W. BERRY, ADMINISTRATORS

BY Richard V. Lang

THEIR ATTORNEY.

United States Patent Office 3,205,376
Patented Sept. 7, 1965

3,205,376

VARIABLE WIDTH NANOSECOND PULSE GENERATOR UTILIZING STORAGE DIODES HAVING SNAP-OFF CHARACTERISTICS

David L. Berry, deceased, late of Lincoln, N.Y., by Lomond I. Berry and Mary W. Berry, administrators, Lincoln, N.Y., and William Peil, Clay, N.Y., assignors to General Electric Company, a corporation of New York
Filed Dec. 26, 1962, Ser. No. 247,396
7 Claims. (Cl. 307—88.5)

This invention relates to apparatus for generating electric pulses of short duration and, in particular, to pulse generating apparatus permitting electronic variation in the width of the pulses produced thereby. The invention is related to the invention disclosed in application S.N. 247,395 concurrently filed on behalf of the present inventors, entitled "Electronically Adjustable Pulse Generator."

In many electronic applications it is desirable to have a pulse generator capable of producing pulses at a repetition rate on the order of forty megacycles per second or more, the generator permitting variation of pulse width in the fractional and lower integral nanosecond (1/1,000-000,000th second) range. Prior art pulse generators have permitted mechanical variation in pulse width and enabled generation of nanosecond pulses. None of the prior art pulse generators known, are capable of generation of electronically variable width nanosecond pulses at a repetition rate of forty megacycles or more. The present invention overcomes the prior art limitations on pulse generation.

It is an object of the invention to provide an improved pulse generator.

It is an object of the invention to provide an improved pulse generator permitting electronic variation in pulse width.

It is another object of the invention to provide a generator for supplying pulses having widths in the fractional and lower integral nanosecond range.

It is another object of the invention to provide apparatus for pulse generation permitting electronic variation of pulse width in the fractional and lower integral nanosecond range.

It is a further object of the invention to provide an electronically variable width nanosecond pulse generator capable of a repetition rate of at least forty megacycles.

Briefly stated, in accordance with the illustrated embodiments of the invention, pulse generation is effected in a circuit configuration utilizing storage diodes having "snap-off" characteristics. The pulse generator includes a source of periodic waves of radio frequency coupled to two parallel channels in each of which a snap-off storage diode is provided. In one of these channels the storage diode is connected in shunt with the signal path and so poled that positive going pulses of the applied signals are attenuated by the presence of the low impedance shunting effect of the diode while negative going pulses of the signal are initially attenuated, and then abruptly passed as the diode snaps off to become non-conductive. In the second channel, to which waves of instantaneously opposing polarity are applied, the storage diode is inversely poled so that applied negative going signals are attenuated while positive going signals are initially attenuated and then abruptly passed as the diode snaps off. At the respective moments of snap off, step waveforms of respectively opposite polarity are created in the separate channels. These pulses are then applied to a tunnel diode operated in a bi-stable mode whereby the initial differentiated pulse initiates an output pulse while the second pulse terminates an output pulse. Means are provided for electronically adjusting the instant of snap-off of the respective diodes so as to control the duration of the output pulse.

In accordance with another embodiment of the invention, storage diodes of the snap-off variety are connected in series in respective channels.

The subject matter of the invention is particularly pointed out and distinctly claimed in the concluding portion of the specification. The invention, however, may best be understood by reference to the following description taken in connection with the following drawings in which:

Figure 1:
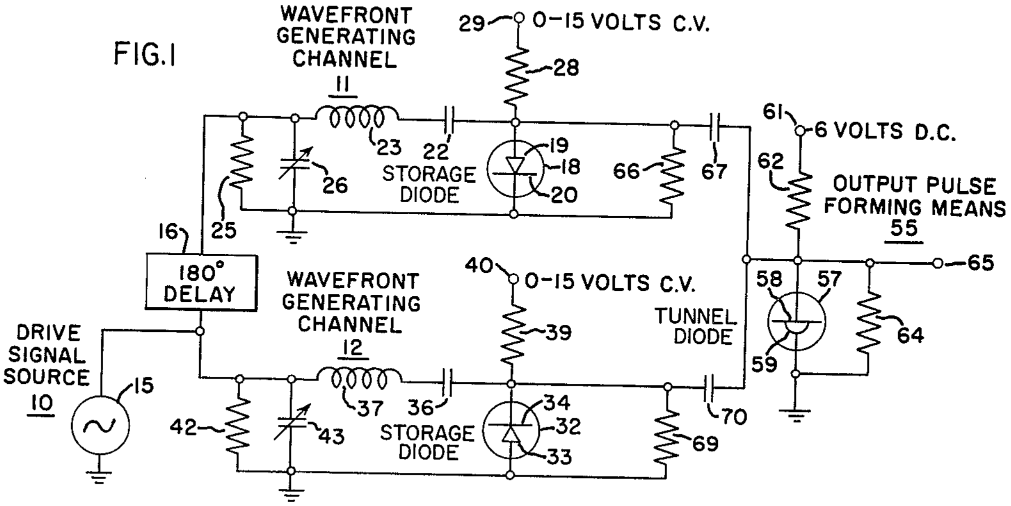
FIG. 1 is a circuit diagram illustrating one embodiment of the variable width nanosecond pulse generator of the invention utilizing shunt connected snap-off storage diodes.

With reference to FIG. 1, the embodiment of the invention illustrated therein, considered as a whole, comprises a drive signal source 10, wavefront generating channels 11 and 12 connected to source 10, and an output pulse forming means 55 connected to the wavefront generating channels 11 and 12. Signal source 10 provides a drive signal for simultaneous application to wavefront generating channels 11 and 12. Channels 11 and 12 operate upon the applied drive signal to produce wavefronts which after differentiation form short duration pulses for application to output pulse forming means 55, control means being provided in at least one of the channels to vary the time interval between the generated wavefronts in the respective channels. Otuput pulse forming means 55 receives the differentiated pulses in channels 11 and 12 and produces a voltage pulse output having a width equal to the time interval between the pair of differentiated pulses applied thereto.

The drive signal source 10 may comprise a sine wave generator 15, as shown, having a frequency corresponding to the desired pulse output repetition rate, e.g., fifty megacycles per second. The sine wave output of generator 15 is applied in parallel to wavefront generating channels 11 and 12 through appropriate transmission lines, the signal applied to channel 11 being delayed approximately 180° or one-half cycle generator 15 by means of phase-shift network 16. A sine wave generator with push-pull outputs may be utilized as an alternative to phase-shift network 16.

Wavefront generating channel 11, which produces a negative wavefront from which a negative differentiated pulse is derived, comprises a storage diode 18 having an anode electrode 19 and a cathode electrode 20. Anode electrode 19 of storage diode 18 is connected to phase-shift network 16 through the serial combination of capacitor 22 and inductor 23, the latter two components forming a filter which allows the drive signal from generator 15 to pass to storage diode 18 but blocks the high frequency components in the wavefront generated by storage diode 18. Anode 19 of storage diode 18 is also connected through resistor 28 to terminal 29, a variable control voltage source being connected to terminal 29 to adjust the bias on storage diode 18. Cathode electrode 20 of storage diode 18 is connected to ground. Resistor 25, connected between a terminal of inductor 23 and ground, has a value selected to make the impedance of the transmission line from phase-shift network 16 equal to its characteristic impedance and thus serves to terminate the transmission line. Variable capacitor 26, connected across resistor 25, serves to tune out or cancel the net inductance of wavefront generating channel 11 as seen from generator 15 to achieve a more nearly resistive termination.

Wavefront generating channel 12, which produces a positive wavefront from which a positive differentiated pulse is derived, similarly comprises a storage diode 32 having an anode electrode 33 and a cathode electrode 34. Cathode electrode 34 of storage diode 32 is connected to generator 15 through capacitor 36 and inductor 37. The latter circuit elements comprise a filter which prevents the high frequency components in the wavefront generated by diode 32 from reaching generator 15, while permitting transmission of the sine wave signal from generator 15 to storage diode 32. Cathode electrode 34 of storage diode 32 is also connected, through resistor 39 to terminal 40, a variable control voltage source being connected to terminal 40 to adjust the bias on storage diode 32. Anode electrode 33 of storage diode 32 is connected to ground. Resistor 42, connected between a terminal of inductor 37 and ground, has a value selected to make the impedance of the transmission line from generator 15 equal to its characteristic impedance and thus serves to terminate the transmission line. Variable capacitor 43, connected across resistor 42, serves to tune out or cancel the net inductance of wavefront generating channel 12 as seen from generator 15 to achieve a more nearly resisting termination.

Output pulse forming means 55 comprises a tunnel diode 57 having an anode electrode 58 and a cathode electrode 59. Anode electrode 58 of tunnel diode 57 is connected to terminal 61 through resistor 62, a D.C. bias potential being applied to terminal 61. Cathode electrode 59 of tunnel diode 57 is connected to ground. A load resistor 64 is connected between the anode and cathode electrodes 58 and 59 respectively of tunnel diode 57. Output terminal 65 is connected to anode electrode 58. Output pulse forming means 55 includes a pair of differentiating circuits, one circuit being connected to the output of each waveform generating channel. The differentiating circuit connected to the output of wavefront generating channel 11 comprises a resistor 66 connected between anode electrode 19 and cathode electrode 20 of storage diode 18 and a capacitor 67 connected between anode electrode 19 of storage diode 18 and anode electrode 58 of tunnel diode 57. The differentiating circuit connected to the output of wavefront generating channel 12 comprises a resistor 69 connected between anode electrode 33 and cathode electrode 34 of storage diode 32 and a capacitor 70 connected between cathode electrode 34 of storage diode 32 and anode electrode 58 of tunnel diode 57.

In accordance with the invention, storage diodes 18 and 32 in wavefront generating channels 11 and 12 respectively provide wavefronts which control the formation and the width of the output pulse. A storage diode is a semiconductor PN junction device which exhibits charge storage or capacitive effects when the diode is biased in the reverse direction, having been previously biased in the forward direction. This charge storage effect produces a transient phenomenon in that when the forward bias terminates and the reverse bias is applied, that the diode continues to exhibit a low impedance. After the stored charges are removed, the impedance increases abruptly, causing an abrupt cessation of reverse current flow.

The charge storage effect results from the temporary storage of minority carriers which are injected into the P and N regions of the diode during the period when the diode is biased in the forward direction, i.e., holes flow into the N region and electrons flow into the P region of the diode. Upon application of a reverse bias current to the storage diode, the diode initially presents a very low impedance to the reverse voltage as the transient reverse current occurs due to the return flow of the previously injected minority carriers. Instantly, upon removal of the injected carriers, the diode abruptly assumes its normal high reverse impedance state. This abrupt change in conductivity is utilized in the pulse generator of the invention. The number of injected minority carriers and hence the duration of the transient current upon application of a reverse bias is in part a function of the total forward bias applied to the storage diode. For a more complete discussion of the semi-conductor physics involved in this storage effect, reference is made to an article by Robert H. Kingston entitled "Switching Time in Junction Diodes and Junction Transistors" appearing at pp. 829–834 of Volume 42 of the Proceeding of the Institute of Radio Engineers for May 1954; or to an article by J. L. Moll entitled "P-N Junction Charge-Storage Diodes" appearing at pp. 43–53 of Volume 50 of the Proceedings of the Institute of Radio Engineers for January, 1962.

Parametric diodes and snap-off diodes represent types of storage diodes now available. The latter type is distinguished from the former by the existence therein of a physically more abrupt junction between the P and N type materials which produces a wavefront having a rapid rise time. Storage diodes 18 and 32 in the embodiment illustrated in FIG. 1 may be either snap-off diodes or parametric diodes, having the snap-off property.

The storage diodes currently available operate with sinusoidal signal sources lying in the range of 40–200 megacycles. It should be apparent, however, that the frequency spectrum may be extended substantially in both directions dependent upon the characteristics of the available diodes. The snap-off characteristic of a storage diode has been described as having a relatively long storage phase, during which the impedance of the diode is very small followed by a decay phase in which the impedance climbs abruptly to a very high valve. The storage phase of these diodes lasts for a time comparable to the lifetime of the residual stored carriers created during the conduction period, while the time for the decay may be several orders of magnitude less than the carrier lifetime. For maximum power generation, an optimum relationship occurs when the time integral of the current from current reversal to one quarter cycle later of the applied waves is approximately equal to the total charge stored in the diode at time of current reversal. This may be expressed as follows:

$$q_{\text{diode}(0)} = \int_{t=0}^{t=1/4 f_0} i(t)\,dt$$

where $q_{\text{diode }(0)}$ is the charge stored in the diode to prior injection at the instant ($t_0$) of current reversal, $f_0$ is the repetition frequency of the periodic source, and $i_{(t)}$ is the reverse current flowing in the diode.

It can thus be seen that a direct relationship exists between the charge capable of being injected into the diode and the frequency of the source for which maximum snap-off current—and hence maximum pulse power—is generated.

If one uses too low a frequency, it should be qualitatively apparent that "snap-off" switching will occur at too low a value on the output current waveform to achieve efficient operation. At the other end of the frequency spectrum, one reaches a point at which the frequency is so great that the stored carrier lifetimes are greater than the time required for the applied current to reverse. In that event charges will be perpetually available and snap-off action will never occur, or may occur under the influence of parametric sub-harmonic degeneration. Operation in this latter region is to be avoided.

Figure 2:
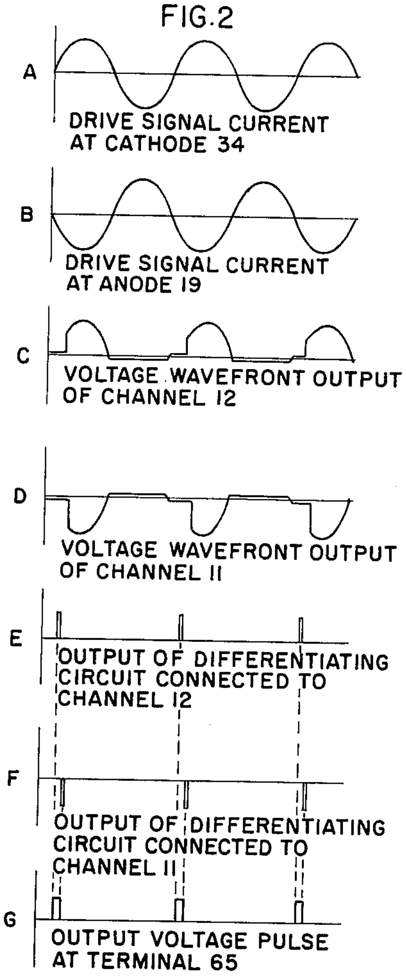
FIGS. 2A–2G illustrate the waveforms present during operation of the circuit of FIG. 1 and the output pulses produced thereby.

In operation, drive signal source 10 and phase-shift network 16 provide the oppositely phased drive signals shown in FIGS. 2A and 2B to storage diodes 32 and 18 respectively. The step wavefronts illustrated in FIGS. 2C and 2D are generated by the snap-off action of the storage diodes 32 and 18 in channels 12 and 11 respectively. Current flows through diode 32 during the entire half cycle during which diode 32 is forward biased and during the initial portion of the half cycle during which diode 32 is reverse biased, the latter current being due to the stored minority carriers injected during the forward bias half cycle. The storage diode thus exhibits a low impedance during the initial portion of the reverse bias half cycle when the transient current is flowing and the voltage drop across the diode terminals is low. When the return flow of the previously injected minority carriers ceases, the impedance of the diode increases abruptly, almost the entire drive voltage then appearing across the diode terminals to produce a wavefront, as illustrated in FIG. 2C. Corresponding action takes place in storage diode 18 as illustrated at 2D.

As previously described, the number of minority carriers injected during the forward bias portion of the applied drive signal is a function in part of the magnitude of the total forward bias on the diode. In the embodiment of the invention illustrated in FIG. 1, the total forward bias on storage diodes 18 and 32 may be conveniently controlled by the application of appropriate control potentials to terminals 29 and 40 respectively. Thus, the duration of the reverse current pulses during the reverse bias half cycle and the point in the reverse bias half cycle at which the abrupt positive and negative wavefronts of voltage occur across storage diodes 32 and 18, as shown in FIGS. 2E and 2F respectively, may be varied to produce a time interval between the aforementioned wavefronts generated in the respective channels. Control could also be exercised by phase-shift techniques utilized in conjunction with the drive signals.

As illustrated in the drawing, the biases applied to the diodes 18 and 32 are supplied by variable control voltage sources having a range of 0–15 volts through a resistance of 360 ohms. This tends to establish a current, absent any signal from the source 10, in the range of from 10–50 milliamperes. When a signal is present, by natural rectification a considerably larger self-rectified current may be present. Accordingly, the control bias adjustment is arranged to provide merely a small shift of the average current level and thereby provide adjustment of the moment of snap-off within the cycle. If one wishes to maintain the center of the pulse constant in time, one may conveniently do this by increasing the bias applied to the diode 18 while decreasing by an equal amount the bias supplied to the diode 32. In a practical case the external bias may in both cases be of the same polarity as illustrated in FIG. 1.

The differentiating circuit, comprising resistor 69 and capacitor 70 and connected to the output of wavefront generating channel 12, produces narrow positive pulses, shown in FIG. 2E, approximately 0.5 nanosecond in duration, corresponding to the wavefront shown in FIG. 2C. Similarly, the differentiating circuit, comprising resistor 66 and capacitor 67 and connected to the output of wavefront generating channel 11, produces the narrow negative pulses illustrated in FIG. 2F, corresponding to the wavefront shown in FIG. 2D. The pulses produced by the differentiating circuits are applied to anode electrode 58 of tunnel diode 57, the high speed of operation of the tunnel diode allowing generation of a narrow output pulse.

Figure 3:
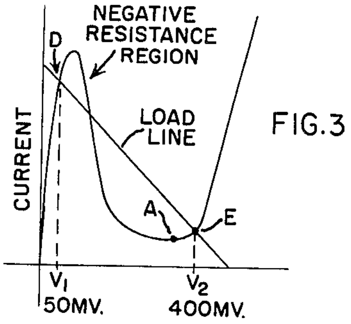
FIG. 3 illustrates the voltage-current relation in the negative resistance region of tunnel diode characteristics.

With reference to the tunnel diode characteristics and the load line shown in FIG. 3, and assuming the tunnel diode 57 to be stable at point D on the load line, corresponding to voltage drop $V_1$ across the diode terminals, application of a positive pulse shown in FIG. 2E to anode electrode 58 switches the tunnel diode 57 to point E on the load line, thereby increasing the voltage drop across tunnel diode 57 and the output voltage at terminal 65 to $V_2$. The tunnel diode remains stable at point E until a negative pulse, shown in FIG. 2F, is applied to anode electrode 58. The tunnel diode then switches back to point D on the load line thereby decreasing the voltage drop across the tunnel diode and the voltage appearing at terminal 65 to $V_1$. Thus, an output pulse, shown in FIG. 2G, having an amplitude equal to $V_2-V_1$ and a duration equal to the time interval between each positive pulse, shown in FIG. 2E, and the corresponding negative pulse, shown in FIG. 2F, appears at terminal 65. The duration of the output pulse, as in the FIG. 1 embodiment, may be controlled by varying the bias potentials of the storage diodes applied to terminals 29 and 40.

A variable width nanosecond pulse generator corresponding to FIG. 1 has been constructed which permitted a pulse width variation between 0.5 and 8 nanoseconds at a repetition rate of 43 megacycles per second. The output pulse amplitude was 0.4 volt. The arrangement illustrated in FIG. 1 may use the following circuit values:

| | |
|---|---|
| 10 ----- | Sinewave generator (at desired repetition rate). |
| 18, 32 -- | Snap-off diodes G. E. Type SSD–558. |
| 22, 36 -- | 470 pf. capacitors. |
| 23, 37 -- | 0.9 micro h. inductors. |
| 25, 42 -- | 50 ohm resistors. |
| 26, 43 -- | 5–45 pf. capacitors. |
| 28, 39 -- | 360 ohm resistors. |
| 57 ----- | G. E. Type TD–102. |
| 62 ----- | 200 ohm resistor. |
| 64 ----- | 12.5 ohm resistor. |
| 66, 69 -- | 56 ohm resistors. |
| 67, 70 -- | 1 pf. capacitor. |

Figure 4:
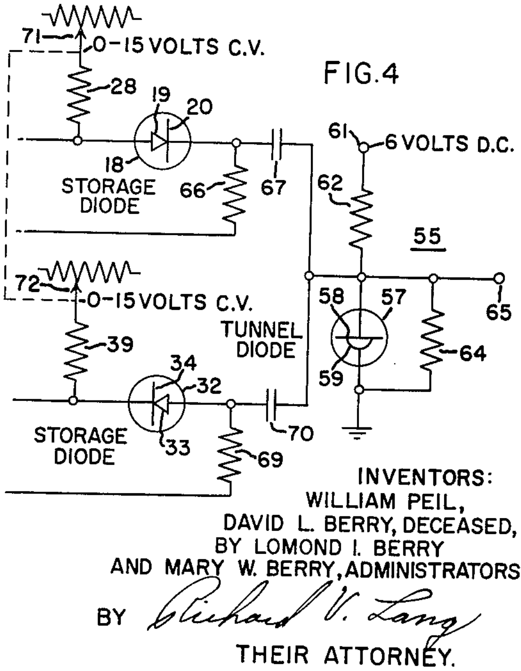
FIG. 4 is a circuit diagram of another embodiment of the variable width nanosecond pulse generator of the invention utilizing series connected snap-off storage diodes.

Another embodiment of the invention is partially illustrated in FIG. 4. The arrangement differs from the initial embodiment in its use of a snap-off diode connected in series rather than in shunt. Similar reference numerals denote elements in FIG. 4 identical to those illustrated in FIG. 1.

The configuration of FIG. 4 differs also in an elaboration of the control voltage systems used to inject current into the snap-off diodes as shown schematically at 71 and 72. The dotted outline is used to indicate a linking of the control mechanism, preferably in opposing directions of adjustment to adjust the width of the pulses without affecting the timing of the center of the pulse. The rate at which electronic variation in pulse width may be achieved may be quite high, even to the point of adjusting the pulse within the pulse-to-pulse intervals. One may adjust the pulse width within this interval (typically 20 nanoseconds). This arises because the timing affecting mechanism depends upon the direct injection of current into the snap-off diode per se rather than upon a parasitic frequency controlling adjunct. The rapidity of response to a change in control voltage is thus due to the natural high frequency ability of the diode. The control mechanism may take the form of a suitably fast electronic circuit.

While the invention has been described in connection with the use of a sinusoidal input waveform, considerable latitude may be utilized in the selection of an input waveform. If a delay network is utilized, as the element 16 in the illustrated embodiments, alternate half-cycles should be symmetrical to insure approximate balance between the outputs of the respective channels. If an arrangement is used where opposing waveforms are synthesized, as by the use of a push-pull drive, there is no requirement that the input waveform be symmetrical. As indicated earlier, the input waveform should have a period greater than the desired output pulse duration and sufficient energy content to excite the snap-off phenomena.

When short duration pulses of the fractional and integral nanosecond variety are being discussed in practical circuit configurations, like those disclosed here, it is apparent that transit times are so substantial, that the effects taking place in various parts of the circuit may be simultaneous, in succession or in reversed succession dependent upon the method of chronology. Since the network synthesizes a pulse at the output terminal, dependent on the relative time of arrival there of two wavefronts traveling on different paths, it is to this point that the measurement of time is referred. (It is of little consequence that a wavefront may have been initiated in channel 1 first, only to arrive at the output terminal after the wavefront initiated in channel 2.) The claims have accordingly used the term "relative" to denote timing with respect to the arrival at the output terminal of the effect of the respective electrical phenomena. Since the input waveform is of a relatively lower frequency, the relative timing problem is less acute in the input portions of the circuit.

While the illustrated arrangements have shown a single alternating input waveform feeding each channel and cooperating with a controlled current injection to achieve differential snap-off times, one may also use an input waveform consisting of a simultaneously applied pair of oppositely poled unidirectional pulses poled to snap-off the respective diodes in the individual channels. At the same time sufficient current is supplied by the control potentials to provide the required forward injection to achieve snap-off.

The foregoing embodiments represent a peculiarly effective means of producing nanosecond pulses at the 40 plus megacycle rate. They represent an ideal fitting of the timing capabilities of the snap-off diodes to the rapid cycling time of the tunnel diode. In combining these devices, one not only achieves a flexibility and rapidity of pulse width (or timing) control which is not readily available by other means, but one also produces an output pulse which is singularly free from the small time jitter that one has come to expect in self-excited or tunnel diode driven tunnel diode pulse generators. Measurements have indicated that the present arrangements reduce the typical jitter of $10–20\times10^{-12}$ seconds to a factor of less than $1\times10^{-12}$ seconds. This may be explained by the fact that the snap-off action used in the snap-off diodes for control of the tunnel diode is essentially a reactive phenomena, and not subject to the usual noise considerations present in resistive drive devices. This is also partially attributable to the relatively large signals which are available by the snap-off action.

One may add that the use of a common input waveform for the respective channels serves as a peculiarly steady time reference upon which to achieve the desired vernier adjustments in pulse width and/or position.

While the invention has been disclosed in specific embodiments, it should be apparent that many modifications will be obvious to those skilled in the art. Accordingly, it is intended in the appended claims to claim all such variations as fall within the true spirit and scope of the invention.

What is claimed as new and desired to be secured by Letters Patent of the United States is:

1. A pulse generator comprising:
(a) a source of alternating waves of pre-determined frequency,
(b) a first channel having waves applied thereto from said source, said channel including a storage diode having snap-off characteristics connected in said channel to permit transmission of positive currents and to effect a sharp reduction in transmission abruptly, but at a time appreciably after onset of applied negative currents at said pre-determined frequency to create a first wavefront,
(c) a second channel having waves applied thereto from said source of a polarity opposing those applied to said first channel, said second channel having a snap-off storage diode connected to permit transmission of negative currents and to effect a sharp reduction in transmission abruptly, but at a time appreciably after onset of positive currents at said pre-determined frequency to create a second wavefront,
(d) means coupled to at least one of said channels to time said snap-offs at relatively different instants in time within an interval during which the amplitudes of said waves at said respective diodes are substantial,
(e) first and second differentiating means coupled to said respective channels for deriving a pair of short duration pulses of mutually opposite polarity timed with said respective wavefronts, and
(f) a bi-stable tunnel diode pulse generator coupled to said differentiating means and producing an output pulse timed by said short duration pulses.

2. The arrangement set forth in claim 1 wherein said timing is effected by an offset of the relative phase of the waves applied to the respective storage diodes.

3. The arrangement set forth in claim 1 wherein said timing is effected by current injection in one of said storage diodes.

4. The arrangement set forth in claim 1 wherein current is injected in both storage diodes and adjusted in equal but opposite amounts to control the width of the output pulse while retaining the periodicity of the output pulses unchanged.

5. The arrangement set forth in claim 1 wherein said storage diodes are series connected in their respective channels.

6. The arrangement set forth in claim 1 wherein said storage diodes are shunt connected in their respective channels.

7. A pulse generator comprising:
(a) a source of alternating waves of pre-determined frequency,
(b) a first channel having waves applied thereto from said source, said channel including a storage diode having snap-off characteristics connected in said channel to permit transmission of positive currents and to effect a sharp reduction in transmission abruptly, but at a time appreciably after onset of applied negative currents at said pre-determined frequency to create a first wavefront,
(c) a second channel having waves applied thereto from said source of a polarity opposing those applied to said first channel, said second channel having a snap-off storage diode connected to permit transmission of negative currents and to effect a sharp reduction in transmission abruptly, but at a time appreciably after onset of positive currents at said pre-determined frequency to create a second wavefront,
(d) means coupled to at least one of said channels to time said snap-offs at relatively different instants in time within an interval during which the amplitudes of said waves at said respective diodes are substantial,
(e) first and second differentiating means coupled to said respective channels for deriving a pair of short duration pulses of mutually opposite polarity timed with said respective wavefronts, and
(f) a pulse generator coupled to said differentiating means responsive to pulses of one polarity to initiate an output pulse and responsive pulses of the other polarity to terminate said output pulse.

No references cited.

ARTHUR GAUSS, *Primary Examiner.*

JOHN W. HUCKERT, *Examiner.*